(12) United States Patent
Cadotte, Jr.

(10) Patent No.: US 7,952,399 B1
(45) Date of Patent: May 31, 2011

(54) LOW PHASE NOISE HIGH SPEED DIGITAL DIVIDER

(75) Inventor: Roland Cadotte, Jr., Freehold, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/355,872

(22) Filed: Jan. 19, 2009

(51) Int. Cl.
*H03B 19/00* (2006.01)
(52) U.S. Cl. .......................... 327/117; 327/202; 377/47
(58) Field of Classification Search .................. 327/115, 327/117, 118, 202, 203; 377/47, 48
See application file for complete search history.

(56) References Cited

U.S. PATENT DOCUMENTS

| | | | | |
|---|---|---|---|---|
| 3,358,154 A * | 12/1967 | Hung | .............................. | 326/18 |
| 3,437,832 A * | 4/1969 | Kopetski | ...................... | 377/123 |
| 4,156,154 A * | 5/1979 | Iizuka | .......................... | 327/215 |
| 4,394,769 A * | 7/1983 | Lull | .............................. | 377/116 |
| 4,469,962 A * | 9/1984 | Snyder | ......................... | 327/203 |
| 4,591,737 A * | 5/1986 | Campbell | ..................... | 327/202 |
| 4,695,743 A * | 9/1987 | Des Brisay, Jr. | ............... | 327/203 |
| 4,855,895 A * | 8/1989 | Shigaki et al. | ................ | 363/157 |
| 5,148,050 A * | 9/1992 | Koide | .......................... | 327/115 |
| 2010/0007396 A1* | 1/2010 | Bailey | .......................... | 327/202 |
| 2010/0026358 A1* | 2/2010 | Bancel et al. | ................. | 327/202 |

* cited by examiner

*Primary Examiner* — Lincoln Donovan
*Assistant Examiner* — William Hernandez
(74) *Attorney, Agent, or Firm* — Duane Morris LLP

(57) ABSTRACT

A frequency divider circuit includes a master-slave flip-flop having a master flip-flop and a slave flip-flop. The slave flip-flop is connected to the master flip-flop. The master flip-flop includes a first plurality of logic gates and is configured to receive a first clock signal. The slave flip-flop includes a second plurality of logic gates and is configured to receive a second clock signal. The second plurality of logic gates is implemented using single-ended diode-transistor logic (DTL).

20 Claims, 4 Drawing Sheets

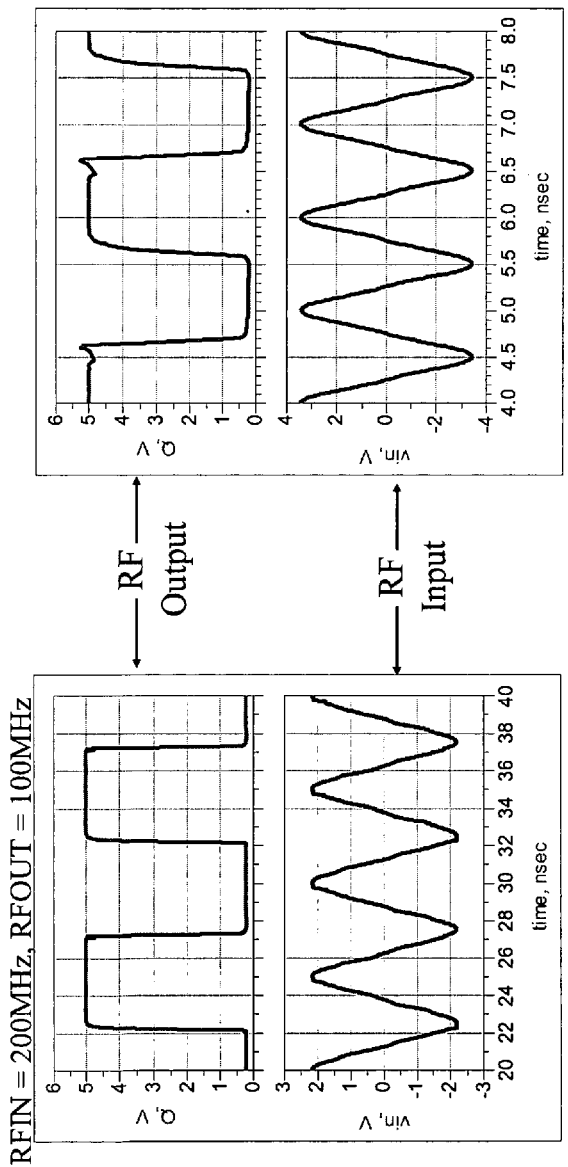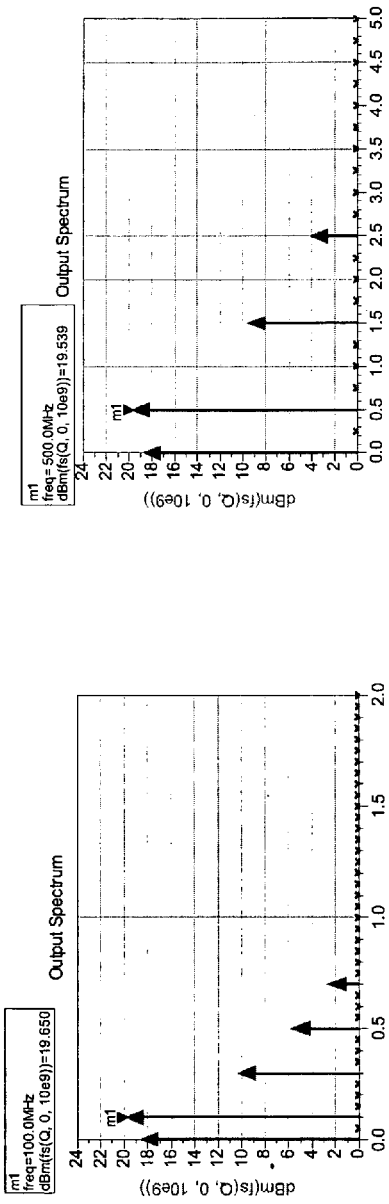

LOW PHASE NOISE HIGH SPEED DIGITAL DIVIDER

FIELD OF DISCLOSURE

The disclosed system and method relate to frequency divider circuits. More specifically, the disclosed system and method relate to high frequency digital frequency divider circuits with improved phase noise performance.

BACKGROUND

Frequency dividers, such as divide-by-two frequency dividers, receive a clock input at one frequency and deliver an output signal at half the frequency of the clock input. Frequency dividers are used in such applications as phase-locked loops (PLL), sensors, and electronic watches. Typical applications focus on designing the frequency dividers to maximize speed or minimize power consumption. Optimization of frequency dividers for speed or power consumption typically results in complex circuits with numerous electronic components. However, such circuits sacrifice the phase noise performance in order to obtain higher operating speeds and lower power consumption.

An improved frequency divider circuit is desirable.

SUMMARY

In some embodiments, a frequency divider circuit includes a master-slave flip-flop having a master flip-flop and a slave flip-flop. The slave flip-flop is connected to the master flip-flop. The master flip-flop includes a first plurality of logic gates and is configured to receive a first clock signal. The slave flip-flop includes a second plurality of logic gates and is configured to receive a second clock signal. The second plurality of logic gates is implemented using single-ended diode-transistor logic (DTL).

In some embodiments, a digital frequency divider circuit includes a master flip-flop and a slave flip-flop. The master flip-flop has a first plurality of logic gates and is configured to receive a first clock signal. The slave flip-flop is connected to the master flip-flop and is configured to receive a second clock signal. The slave flip-flop includes four NAND gates. Each of the NAND gates includes a first diode connected to a first input port and a second diode connected to a second input port. The first and second diodes are connected in parallel. A third diode is connected to the first and second diodes and to a base of a transistor. A collector of the transistor is connected to an output port. The third diode is for controlling the output of the transistor.

In some embodiments, an integrated circuit includes a master-slave flip-flop having a master flip-flop, a slave flip-flop connected to the master flip-flop, and an inverter connected to the slave flip-flop. The master flip-flop is configured to receive a first clock signal and includes a plurality of logic gates implemented using a first logic type. The slave flip-flop is configured to receive a second clock signal and includes four NAND gates. Each of the NAND gates includes a first diode connected to a first input port and a second diode connected to a second input port. The first and second diodes are connected in parallel. A third diode is connected to the first and second diodes. A base of a transistor is connected to the third diode and a collector of the transistor is connected to an output port. The third diode is configured to control the output of the transistor. The inverter is configured to provide the slave flip-flop with the second clock signal.

BRIEF DESCRIPTION OF THE DRAWINGS

FIG. 3 illustrates an input waveform having a frequency of 200 MHz and the corresponding output waveform of the digital frequency divider circuit illustrated in FIG. 1.

FIG. 4 illustrates an input waveform having a frequency of 1000 MHz and the corresponding output waveform of the digital frequency divider circuit illustrated in FIG. 1.

FIG. 5 illustrates is a graph showing the spectrum of the output waveform illustrated in FIG. 3.

FIG. 6 illustrates is a graph showing the spectrum of the output waveform illustrated in FIG. 4.

DETAILED DESCRIPTION

Figure 1:
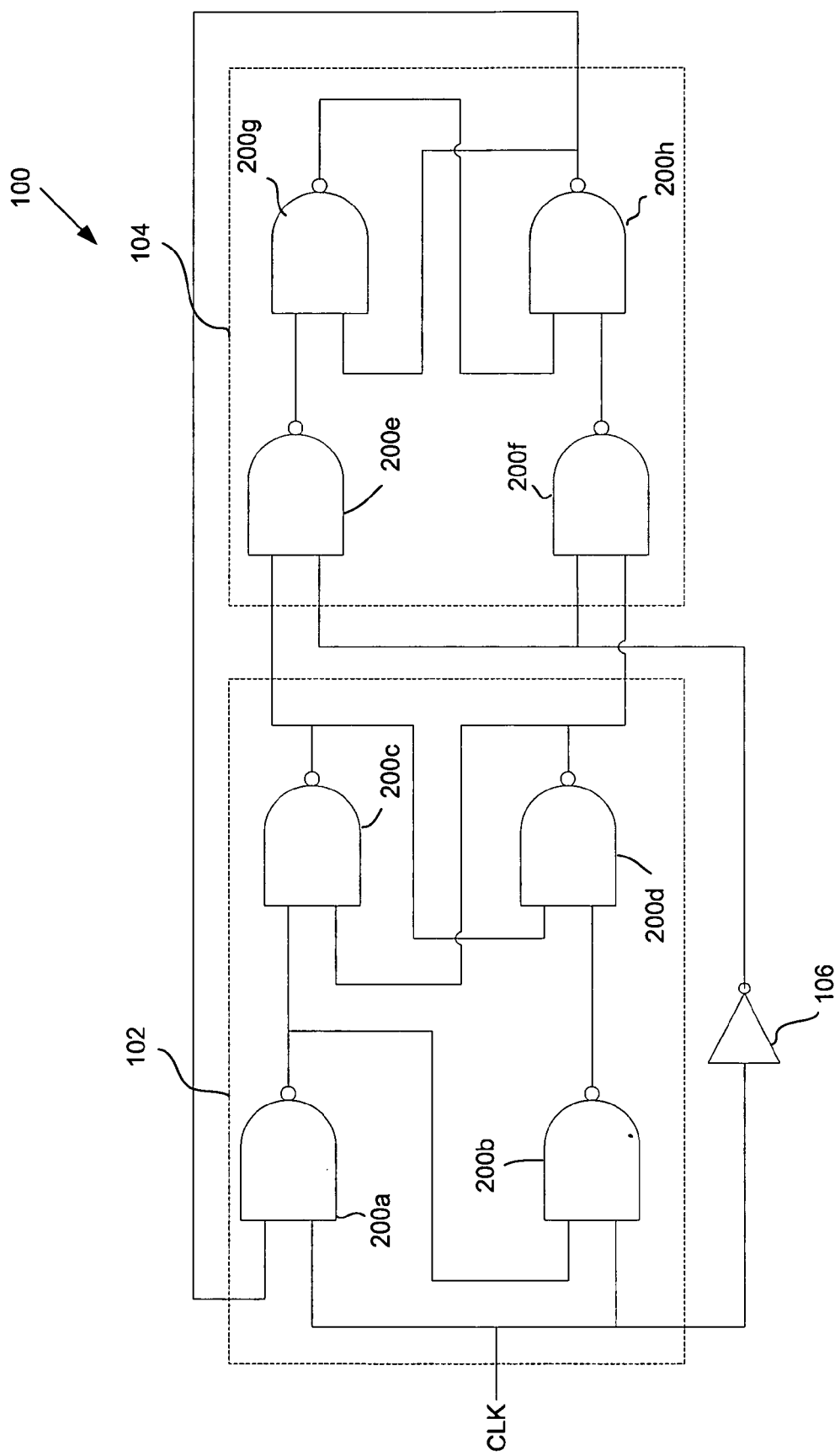
FIG. 1 illustrates one embodiment of a digital frequency divider circuit.

FIG. 1 illustrates a master-slave flip-flop architecture of an improved digital frequency divider circuit 100. As shown in FIG. 1, the frequency divider circuit 100 is a D flip-flop that includes a master flip-flop 102 and a slave flip flop 104. Although a D flip-flop is illustrated and described, one skilled in the art will understand that other flip-flops including, but not limited to, JK flip-flops, SR flip-flops, or the like may be used to implement a digital frequency divider. Both the master flip-flop 102 and the slave flip-flop 104 are shown with four NAND gates 200a-200d and 200e-200h, respectively. Other logic gates including, but not limited to, AND gates, NOR gates, and OR gates may be implemented to create a frequency divider circuit 100.

As shown in FIG. 1, NAND gates 200a and 200b receive the clock input, CLK, at a first input terminal. The second input terminal of NAND gate 200b is connected to the output of NAND gate 200a. The second input terminal of NAND gate 200a receives the output of NAND gate 200h of slave flip-flop 104. The output of NAND 200b is fed into one of the input terminals of NAND gate 200d. The other input terminal of NAND gate 200d is connected to the output of NAND gate 200c.

NAND gate 200c receives the outputs of NAND gates 200a and 200d. The output of NAND gate 200c is fed into one of the input terminals of NAND gate 200e of slave flip-flop 104. NAND gates 200e and 200f receive the output of the inverter 106, which receives and inverts the CLK signal. Accordingly, the slave flip-flop 104 is separately clocked from master flip-flop 102. Separately clocking the master flip-flop 102 and the slave flip-flop 104 separates the phase noise of the master flip-flop 102 from the slave flip-flop 104. Since the master flip-flop 102 and the slave flip-flop 104 are separately clocked, the phase noise of the frequency divider circuit 100 is based primarily on the phase noise introduced by the slave flip-flop 104 as the output of the slave flip-flop 104 is used as the output of the frequency divider circuit 100.

NAND gate 200f also receives as one of its inputs from the output of NAND gate 200d of the master flip-flop 102. The outputs of NAND gates 200e and 200f are respectively received by an input of NAND gate 200g and NAND gate 200h. The other input terminal of NAND gate 200g is connected to the output of NAND gate 200h, and the other input terminal of NAND gate 200h is connected to the output terminal of NAND gate 200g. The output of NAND gate 200h is fed back to the input terminal of NAND gate 200a of master flip-flop 102. The output of NAND gate 200g is used as the output of the frequency divider circuit 100.

In some embodiments, each of the NAND gates 200a-200h of frequency divider circuit 100 is constructed using single-ended diode-transistor logic (DTL). DTL has improved phase noise performance compared to other logic types such as Emitter Coupled Logic (ECL) or transistor-transistor logic (TTL), which are conventionally used to implement a digital frequency divider as described below.

Figure 2:
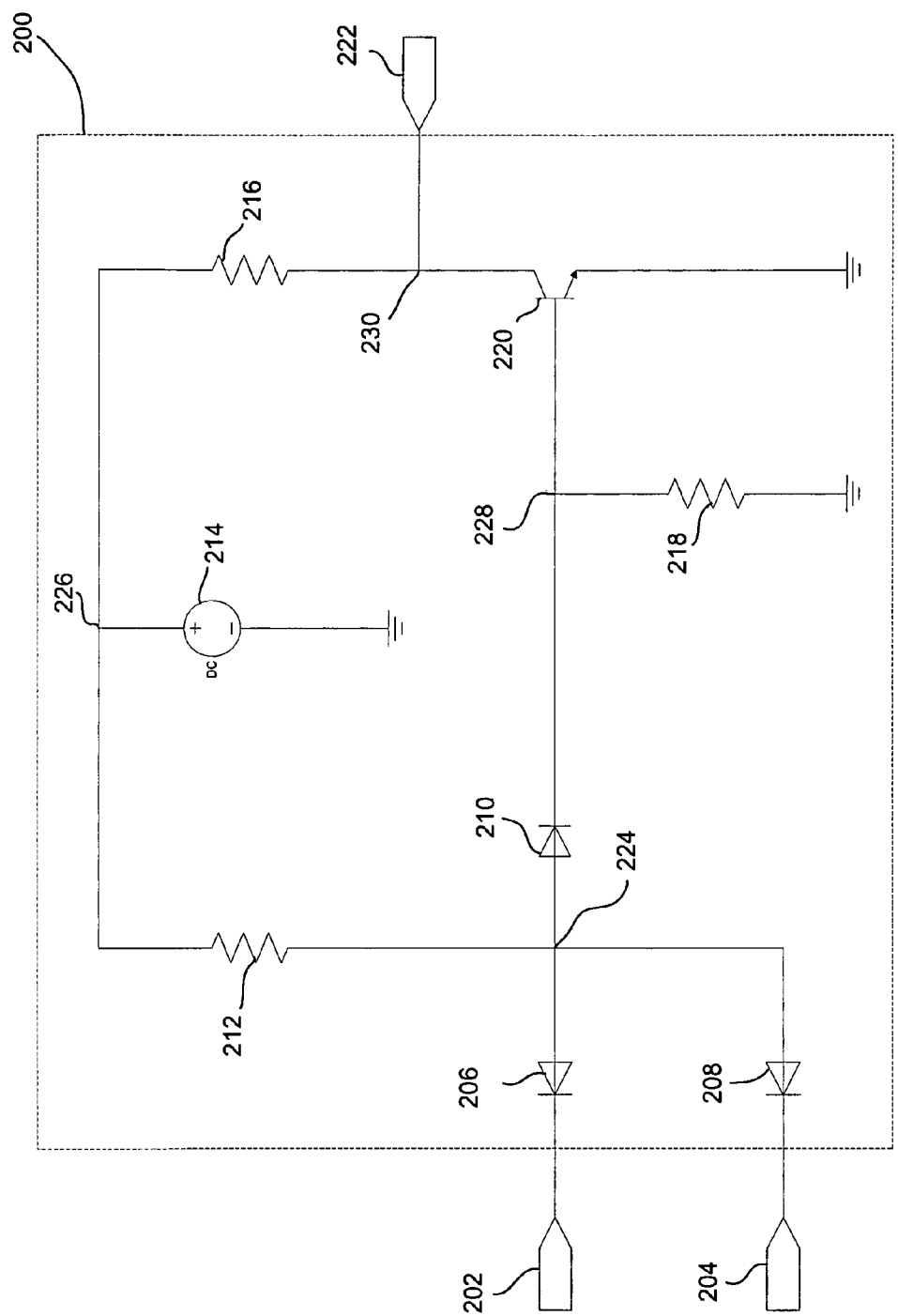
FIG. 2 is a circuit diagram of one example of a NAND gate shown in FIG. 1.

FIG. 2 illustrates one example of a NAND gate 200 constructed using single-ended DTL. As shown in FIG. 2, NAND gate 200 includes a first input terminal 202 and a second input terminal 204. Each of the input terminals 202 and 204 are respectively connected to the cathodes of diodes 206 and 208. The anodes of diodes 206 and 208 are connected at node 224, which is also connected to the anode of diode 210 and to resistor 212. The cathode of diode 210 is connected at node 228 to the base of output transistor 220 and to resistor 218, which is connected to ground. In some embodiments, output transistor is an NPN binary junction transistor (BJT); however, one skilled in the art will understand that other transistors types may be implemented. The emitter of the output transistor 220 is connected to ground, and the collector of the output transistor 220 is connected at node 230 to the output terminal 222 and to resistor 216. Resistor 216 is connected at node 226 to resistor 212 and to DC voltage source 214. In some embodiments, NAND gate 200 is fabricated using an indium gallium phosphide (InGaP) hetero-bipolar transistor (HBT) process to further reduce the phase noise. Other processing techniques including, but not limited to, silicon germanium (SiGe), gallium arsenide field effect transistors (GaAs FETs), or the like may be used.

The values of resistors 212 and 216 and voltage source 214 may be selected to provide the desired amount of voltage and current biasing at nodes 224 and 230. In some embodiments, the voltage source 214 is set at 5 volts, resistor 212 has a resistance of 250 ohms, and resistor 216 has a resistance of 400 ohms. However, one skilled in the art will understand that the voltage and resistance values of voltage source 214 and resistors 212, 216 may be changed to achieve the desired current and voltages throughout the NAND gate 200.

In operation, NAND gate 200 will output a logic one at output port 222 when one or both of the input ports 202, 204 receive a logic zero and will output a logic zero when both the inputs 202, 204 receive a logic one. For example, if input port 202 receives a logic one signal (e.g., a voltage of five volts for purposes of this example) and input port 204 receives a logic zero signal, then the diode 206 will be reversed biased and diode 208 will be forward biased. The voltage drop across a diode when it is forward biased is approximately 0.7 volts, and thus the voltage at node 224 will be pulled towards zero volts when diode 208 is forward biased.

With node 224 at a voltage at or near zero volts, diode 210 will be reversed biased. Diode 210 will be reversed biased because the turn-on voltage (base-emitter voltage) of output transistor 220 is approximately 0.65 volts and the turn-on voltage of diode 210 is approximately 0.7 volts. Accordingly, the voltage at node 224 needs to be approximately 1.35 volts or more to turn on (forward bias) diode 210. Current will not flow through the output transistor 220 when the output transistor 220 is off. Without current flowing through the output transistor 220, there will not be a voltage drop across resistor 216 and the voltage at node 230, and thus at output port 222, will be equal to the voltage of the voltage source 214, which in this example is five volts or a logic one.

Conversely, if both of the input ports 202 and 204 are at a logic one, then both diodes 206 and 208 will be reversed biased. With diodes 206 and 208 reversed biased, the voltage at node 224 will be greater than the 1.35 volts needed to forward bias diode 210 and turn on output transistor 220. When on, the output transistor 220 conducts current, will enter saturation region, and will have a collector-emitter voltage of approximately 0.3 volts or less. Accordingly, the voltage at node 230 and output port 222 is a logic zero as the voltage will be near or at ground.

When the output transistor 220 goes into saturation charge accumulates and is stored at the base of the output transistor 220. If one or both of the input terminals transitions to a logic zero, then the charge stored at the base of transistor 220 needs to be removed to transition the output transistor 220 out of the saturation region and into an off state. Accordingly, resistor 218 is connected between the base of output transistor 220 and ground to enable the stored charge at the base of output transistor 220 to be quickly removed. In some embodiments, the resistance of resistor 218 is 200 ohms, although one skilled in the art will understand that the resistance of resistor 218 may be higher or lower to increases the transition speed of the output transistor 220 and thus the switching speed of the NAND gate 200.

Implementing the logic gates of the frequency divider 100 using single-ended DTL improves the phase noise performance of the frequency divider circuit 100 compared to implementing the logic gates using another logic such as, for example, ECL, differential DTL, and TTL. One improvement of the phase noise performance of the frequency divider circuit 100 is in-part due to the clamping of the internal voltages. The voltage swings using single-ended DTL rapidly increase through the zero crossing regions and are clamped at minimum and maximum values thereby reducing jitter and phase noise. In contrast, a logic gate implemented using ECL does not saturate or turn off any of the transistors as this would limit their high-frequency performance. Accordingly, all the internal and external ECL voltage swings are sinusoidal which results in an increase in phase noise compared to the clamped internal voltages of a single-ended DTL logic gate.

Additionally, the frequency divider circuit 100 may be built with fewer components compared to other logic types with only a few of these components having poor phase noise characteristics. For example, transistors have poor phase noise performance, but a single-ended NAND logic gate 200 may be implemented with only one transistor. In contrast, conventional frequency divider circuits that are implemented using logic other than single-ended DTL may use two or more transistors resulting in poorer phase noise performance. For example, a conventional ECL NAND gate is implemented using three transistors and three resistors and has phase noise of approximately −157 dBm in the 100 MHz to 1 GHz frequency band. Implementing a frequency divider 100 using single-ended DTL logic gates can improve the phase noise performance by 10 dB or more to approximately −167 dBm within the same frequency band. Conventional TTL NAND gates are implemented using four transistors, four resistors, and one diode and have worse phase noise performance than frequency dividers implemented using ECL.

FIG. 3 is a voltage versus time graph illustrating the input and output waveforms of the frequency divider circuit 100 receiving an RF input signal with a frequency of 200 MHz. As shown in FIG. 3, the output waveform of the frequency divider circuit is 100 MHz. FIG. 4 is another voltage versus time graph illustrating the input and output waveforms of the frequency divider circuit 100 receiving an RF input signal with a frequency of 1 GHz and outputting a signal of 500 MHz.

In some embodiments, only the slave flip-flop 104 of the frequency divider circuit is implemented using single-ended DTL and the master flip-flop 102 are implemented using other logic. Only the slave flip-flop 104 may be implemented using single-ended DTL because, as described above, the master flip-flop 102 and the slave flip-flop 104 are separately clocked and the phase noise of the frequency divider circuit 100 is based primarily on the phase noise introduced by the slave flip-flop 104. Example logic types of the master flip-flop 102 include, but are not limited to, ECL, transistor-transistor logic (TTL), or the like.

In some embodiments, the master flip-flop 102 is implemented using differential logic gates. A frequency divider 100 having a master flip-flop 102 implemented using differential logic will cancel other types of noise and unwanted signals found on both input terminals because the differential circuitry rejects common mode signals that are input into the frequency divider 100.

Figure 7:
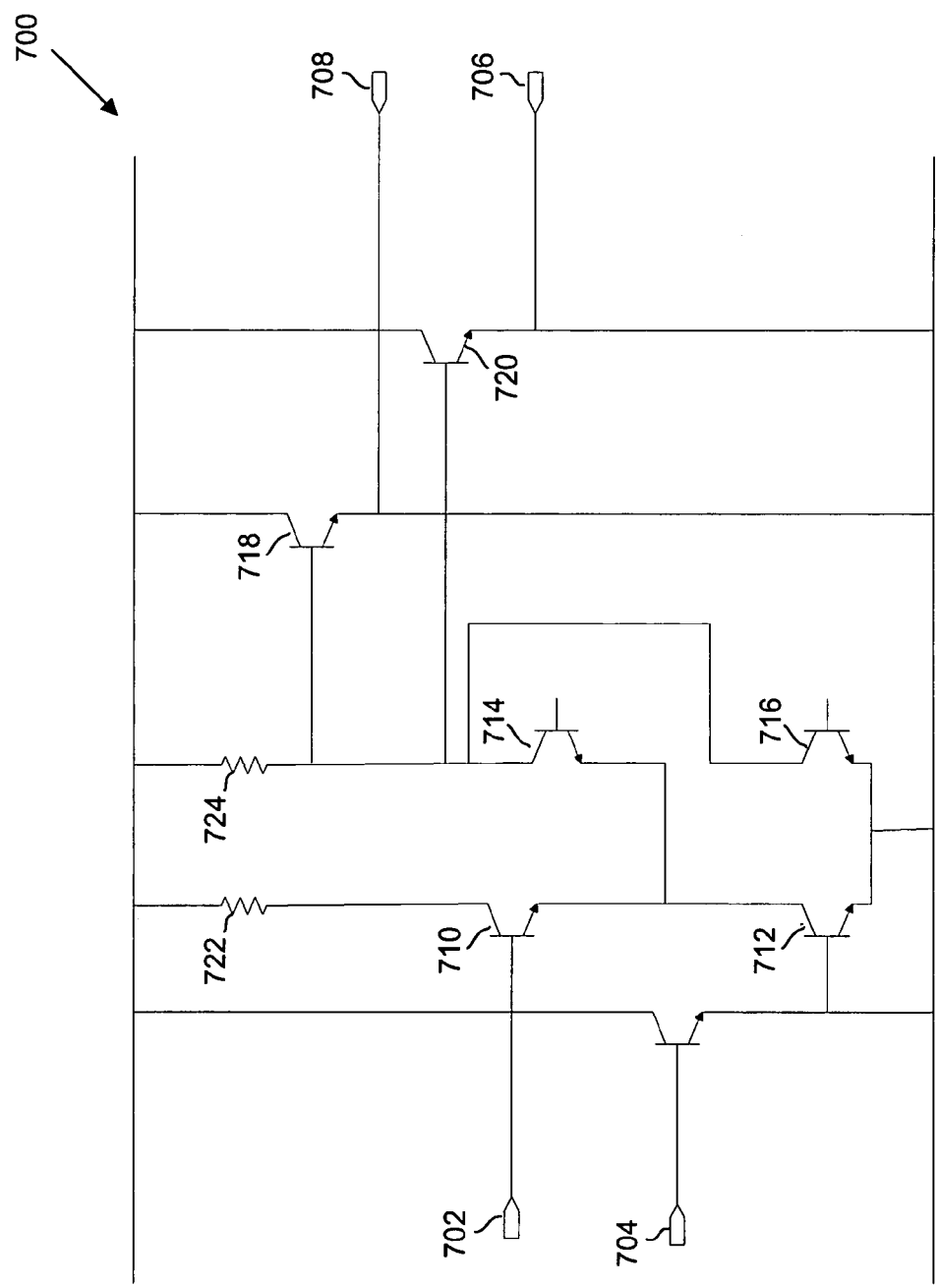
FIG. 7 is a circuit diagram of a differential NAND circuit in accordance with the frequency divider illustrated in FIG. 1.

FIG. 7 illustrates one example of a differential ECL NAND gate 700 that may be used as a master flip-flop 102 in accordance with the frequency divider circuit 100 illustrated in FIG. 1. As shown in FIG. 7, inputs 702 and 704 are complementary inputs of ECL NAND gate 700. Noise or other unwanted signals common to both inputs 702 and 704 will have a minimal effect on the operation of NAND gate 700 since common inputted signals will not change significantly the voltage differences across the terminals of transistors 710, 712, 714, 716. Since the operation of transistors 710, 712, 714, 716 is dependent on the voltage differential across its terminals and not on the absolute voltages on its terminals, noise and other unwanted signals will have minimal impact on the operation of NAND gate 700. Outputs 706, 708 are the output and complementary outputs, respectively of the differential ECL NAND gate 700. Resistors 722, 724 set the bias points for transistors 710, 712, 714, 716. Transistors 718, 720 are output buffers for the differential ECL NAND gate 700.

The benefits of using a slave flip-flop with a differential configuration is minimal because any common mode noise input into the digital divider would have been minimized by the differential master flip-flop. Additionally, since the connections from the master flip-flop to the slave flip-flop are typically short, pickup of any external noise at the input of the slave flip-flop would be minimal. The length of the input lines of the slave flip-flop 104 may be minimized by locating the input lines of the slave flip-flop 104 adjacent to the output lines of the master flip-flop 102. The entire digital divider may be shielded if further pickup of unwanted noise is a problem.

In some embodiments, the speed of the digital frequency divider circuit 100 can be increased by using a logic type in the master flip-flop 102 that is faster than the single-ended DTL logic used in the slave flip-flop 104. For example, if the same logic type is used in both the master flip-flop 102 and slave flip-flop 104, the overall speed of the digital frequency divider 100 would be half of the speed of either the master flip-flop 102 or the slave flip-flop 104. If, for example, a logic type such as ECL is used for the master flip-flop 102, then the speed of the overall digital frequency divider would be dominated by the speed of the DTL of the slave flip-flop 104, since ECL is faster than DTL.

As described above, the frequency divider circuit 100 having a slave flip-flop 104 implemented with single-ended DTL logic gates provides improved phase noise performance compared to frequency divider circuits implemented using other logic types. Additionally, the frequency divider circuit 100 provides the improved phase noise performance for high frequency input signals, e.g., an input signal having a frequency on the order of 2 GHz.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A digital frequency divider circuit, comprising:
    a master-slave flip-flop including:
        a master flip-flop having a first plurality of logic gates and configured to receive a clock signal; and
        a slave flip-flop connected to the master flip-flop, the slave flip-flop including a second plurality of logic gates and configured to receive an inverted version of the clock signal, the second plurality of logic gates implemented using single-ended diode-transistor logic (DTL),
    wherein one of the first and second plurality of logic gates includes four NAND gates.

2. The system of claim 1, wherein the second plurality of logic gates includes the four NAND gates, each of the NAND gates comprising:
    a first diode connected to a first input port;
    a second diode connected to a second input port and to the first diode;
    a transistor having a base, emitter, and a collector, the collector connected to an output port; and
    a third diode connected to the first and second diodes and to the base of the transistor, the third diode for controlling the output of the transistor.

3. The frequency divider of claim 1, wherein the first plurality of logic gates includes the four NAND gates, each of the NAND gates comprising:
    a first diode connected to a first input port;
    a second diode connected to a second input port and to the second diode;
    a transistor having a base, emitter, and a collector, the collector connected to an output port; and
    a third diode connected to the first and second diodes and to the base of the transistor, the third diode for controlling the output of the transistor.

4. The frequency divider circuit of claim 1, further comprising:
    an inverter connected to the slave flip-flop, the inverter configured to invert the clock signal to provide the inverted version of the clock signal.

5. The frequency divider circuit of claim 1, wherein the first plurality of logic gates are implemented using differential logic.

6. The frequency divider circuit of claim 1, wherein the master flip-flop includes the four NAND gates, each of the NAND gates comprising a differential Emitter Collector Logic (ECL) NAND gate.

7. The frequency divider of claim 1, wherein the first plurality of logic gates is implemented with transistor-transistor logic (TTL).

8. The frequency divider of claim 1, wherein the first plurality of logic gates is implemented with Emitter Coupled Logic (ECL).

9. The frequency divider of claim 2, further comprising:
    biasing circuitry connected to the first, second, and third diodes and to the output port, the biasing circuitry including a pair of resistors connected in parallel to a voltage source.

10. A digital frequency divider circuit, comprising:
    a master flip-flop having a first plurality of logic gates and configured to receive a first clock signal; and a slave flip-flop connected to the master flip-flop, the slave flip-flop receiving a second clock signal and including four NAND gates, each of the NAND gates including:
   a first diode connected to a first input port;
   a second diode connected to a second input port and to the first diode;
   a transistor having a base, emitter, and a collector, the collector connected to an output port; and
   a third diode connected to the first and second diodes and the base of the transistor, the third diode for controlling the output of the transistor.

11. The digital frequency divider circuit of claim 10, further comprising an inverter connected to the slave flip-flop, the inverter configured to invert the first clock signal to provide the second clock signal.

12. The digital frequency divider circuit of claim 10, wherein the first plurality of logic gates are implemented using differential logic.

13. The digital frequency divider circuit of claim 10, wherein the master flip-flop includes four differential Emitter Collector Logic (ECL) NAND gates.

14. The frequency divider of claim 10, wherein the first plurality of logic gates are implemented with transistor-transistor logic (TTL).

15. The frequency divider of claim 10, wherein the first plurality of logic gates are implemented with Emitter Coupled Logic (ECL).

16. The frequency divider of claim 10, wherein the NAND gates of the slave flip-flop further include:
   biasing circuitry connected between the first, second, and third diodes and to the output port, the biasing circuitry including a pair of resistors connected in series to a voltage source.

17. An integrated circuit, comprising:
   a master-slave flip-flop including:
   a master flip-flop configured to receive a first clock signal, the master flip-flop including a plurality of logic gates implemented using a first logic type;
   a slave flip-flop configured to receive a second clock signal, the slave flip-flop including four NAND gates, each of the NAND gates including:
      a first diode connected to a first input port;
      a second diode connected to a second input port and to the first diode;
      a transistor having a base, emitter, and a collector, the collector connected to an output port; and
      a third diode connected to the first and second diodes and to the base of the transistor, the third diode for controlling the output of the transistor; and
   an inverter connected to the slave flip-flop, the inverter configured to provide the slave flip-flop with the second clock signal.

18. The integrated circuit of claim 17, wherein the first logic type is differential logic.

19. The integrated circuit of claim 17, wherein each of the NAND gates of the slave flip-flop further includes:
   biasing circuitry connected between the first, second, and third diodes and to the output port, the biasing circuitry including a pair of resistors connected in series to a voltage source.

20. The integrated circuit of claim 17, wherein each of the NAND gates of the slave flip-flop further includes:
   a resistor connected to ground and to the third diode and the output transistor.

* * * * *